(12) United States Patent
Privitera et al.

(10) Patent No.: US 9,025,287 B2
(45) Date of Patent: May 5, 2015

(54) ARC FAULT DETECTION EQUIPMENT AND METHOD USING LOW FREQUENCY HARMONIC CURRENT ANALYSIS

(71) Applicant: STMicroelectronics S.r.l., Agrate Brianza (MB) (IT)

(72) Inventors: Giuseppe Privitera, Misterbianco (IT); Antonio Cataliotti, Palermo (IT); Valentina Cosentino, Palermo (IT); Giovanni Artale, Palermo (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 231 days.

(21) Appl. No.: 13/719,698

(22) Filed: Dec. 19, 2012

(65) Prior Publication Data

US 2014/0168843 A1    Jun. 19, 2014

(51) Int. Cl.
*H01H 9/50* (2006.01)
*G01R 31/02* (2006.01)
*G06F 17/00* (2006.01)
*H02H 1/00* (2006.01)
*G01R 31/14* (2006.01)

(52) U.S. Cl.
CPC .............. *G01R 31/025* (2013.01); *G06F 17/00* (2013.01); *H01H 9/50* (2013.01); *G01R 31/14* (2013.01); *H02H 1/0015* (2013.01)

(58) Field of Classification Search
CPC ......... G01R 31/02; G01R 31/025; H01H 9/50
See application file for complete search history.

(56) References Cited

U.S. PATENT DOCUMENTS

| | | | |
|---|---|---|---|
| 5,185,684 A | 2/1993 | Beihoff et al. |
| 5,452,223 A | 9/1995 | Zuercher et al. |
| 5,561,605 A | 10/1996 | Zuercher et al. |
| 5,682,101 A | 10/1997 | Brooks et al. |
| 5,691,869 A | 11/1997 | Engel et al. |
| 5,706,159 A | 1/1998 | Dollar, II et al. |
| 5,729,145 A | 3/1998 | Blades |
| 5,805,397 A | 9/1998 | MacKenzie |
| 5,815,352 A | 9/1998 | Mackenzie |
| 5,818,237 A | 10/1998 | Zuercher et al. |
| 5,835,321 A | 11/1998 | Elms et al. |
| 5,839,092 A | 11/1998 | Erger et al. |
| 5,963,405 A | 10/1999 | Engel et al. |
| 6,031,699 A | 2/2000 | Dollar, II et al. |

(Continued)

OTHER PUBLICATIONS

Massimo Aiello, et al: "Synchronization Techniques for Power Quality Instruments," IEEE Transations on Instrumentation and Measurement, vol. 56, No. 5, Oct. 2007, pp. 1511-1519.

(Continued)

*Primary Examiner* — Jared Fureman
*Assistant Examiner* — Terrence Willoughby
(74) *Attorney, Agent, or Firm* — Gardere Wynne Sewell LLP

(57) ABSTRACT

An arc fault detection circuit includes a current sensing circuit coupled to a line conductor carrying a current. The current sensing circuit operates to sense current and output data indicative of the sensed current. A processing circuit implements a frequency transform algorithm to transform the output data to frequency data in a low frequency range and with a high spectral resolution where a minimum short time observation window is concerned. The processing circuit identifies an arc fault condition on the line conductor by identifying differences in said frequency data between at least two subsequent observation windows and identifying characteristics which exceed thresholds.

28 Claims, 7 Drawing Sheets

(56) References Cited

U.S. PATENT DOCUMENTS

| | | | |
|---|---|---|---|
| 6,088,205 | A | 7/2000 | Neiger et al. |
| 6,198,611 | B1 | 3/2001 | Macbeth |
| 6,246,556 | B1 | 6/2001 | Haun et al. |
| 6,259,996 | B1 | 7/2001 | Haun et al. |
| 6,362,628 | B2 | 3/2002 | Macbeth et al. |
| 6,388,849 | B1 | 5/2002 | Rae |
| 6,972,572 | B2 | 12/2005 | Mernyk et al. |
| 6,980,407 | B2 | 12/2005 | Kawate et al. |
| 7,003,435 | B2 | 2/2006 | Kolker et al. |
| 7,062,388 | B2 | 6/2006 | Rivers, Jr. et al. |
| 7,068,480 | B2 | 6/2006 | Wong et al. |
| 7,110,864 | B2 | 9/2006 | Restrepo et al. |
| 7,227,729 | B2 | 6/2007 | Parker et al. |
| 7,307,429 | B1 | 12/2007 | Parker et al. |
| 7,307,820 | B2 | 12/2007 | Henson et al. |
| 7,463,037 | B2 * | 12/2008 | Henson et al. ............... 324/536 |
| 8,023,235 | B2 | 9/2011 | Bilac et al. |
| 2009/0168277 | A1 | 7/2009 | Changali et al. |
| 2011/0249370 | A1 | 10/2011 | Nayak et al. |
| 2012/0089266 | A1 | 4/2012 | Tomimbang et al. |

OTHER PUBLICATIONS

Jan B. Beck, et al.: "Arc Fault Detection Through Model Reference Estimation," X-L Synerge, LLC, 2006 SAE International (8 pages).

George D. Gregory, et al.: "More About Arc-Fault Circuit Interrupters," IEEE Transactions on Industry Applications, vol. 40, No. 4, Jul./Aug. 2004, pp. 1006-1011.

Charles Kim, et al.: "Arcing Fault Detection with Experimental Verification Using Antenna for Signal Capture of Radiated Electromagnetic Energy," www.mwftr.com/charlesk.html, 10th Aging Aircraft Conference, Apr. 16-19, 2007, Palm Springs, CA (8 pages).

Carlos E. Restrepo: "Arc Fault Detection and Discrimination Methods," Siemens Energy and Automation, 53rd IEEE Holm Conference, Oct. 2007 (8 pages).

Siemens Energy & Automation, Inc.: "Arc Fault Circuit Interrupter (AFCI)," Product Presentation, 2008.

* cited by examiner

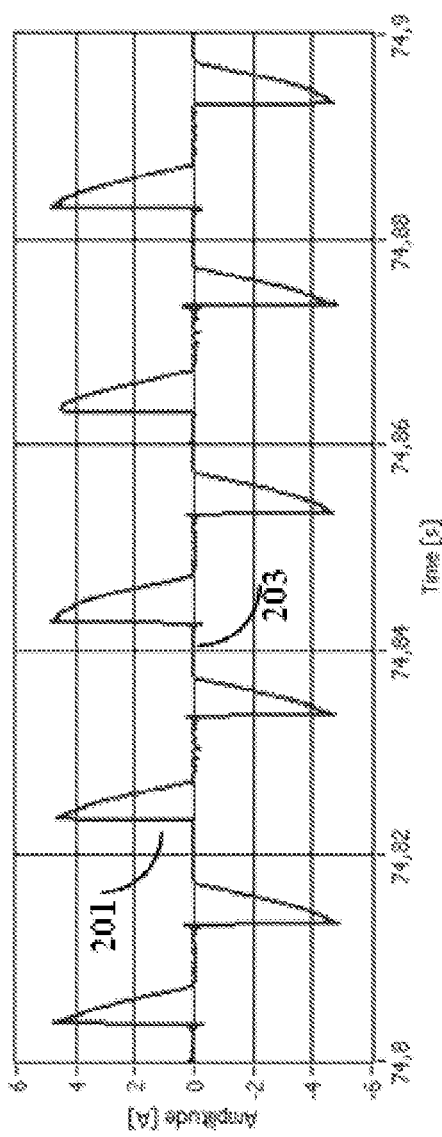
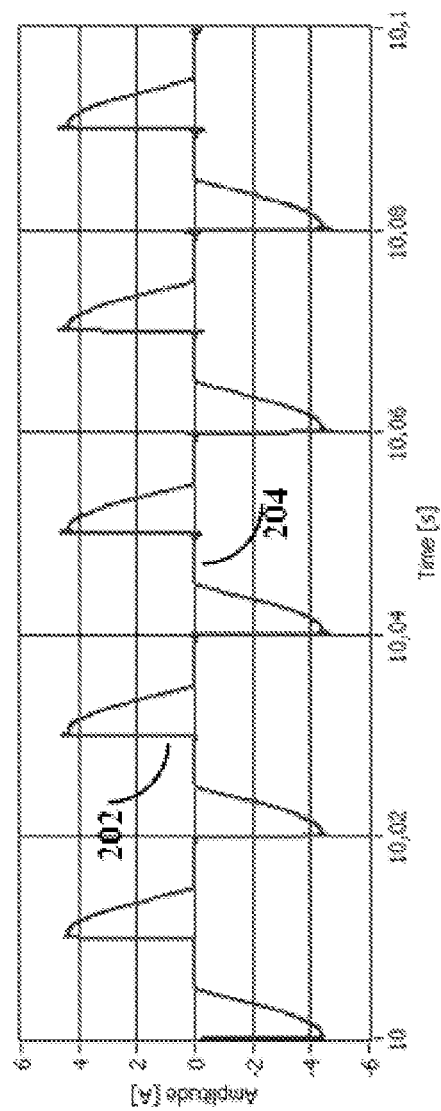
FIG.2A (Prior Art)
FIG.2B (Prior Art)

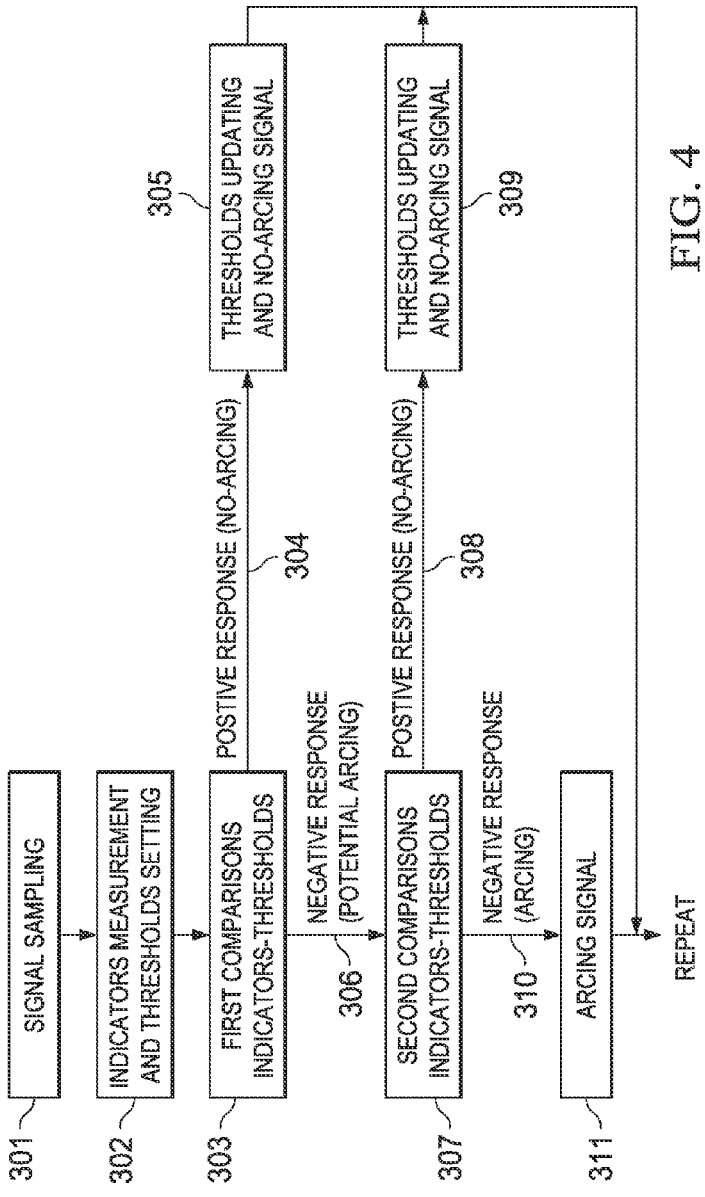
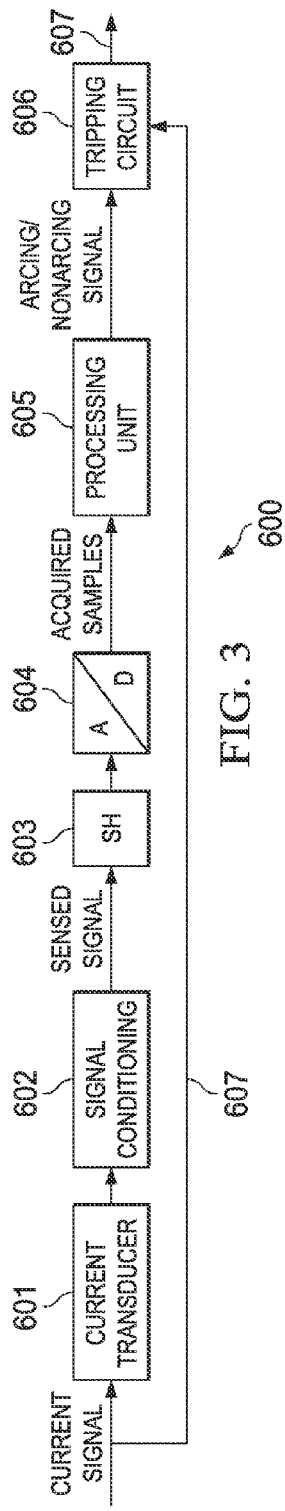
FIG. 3
FIG. 4

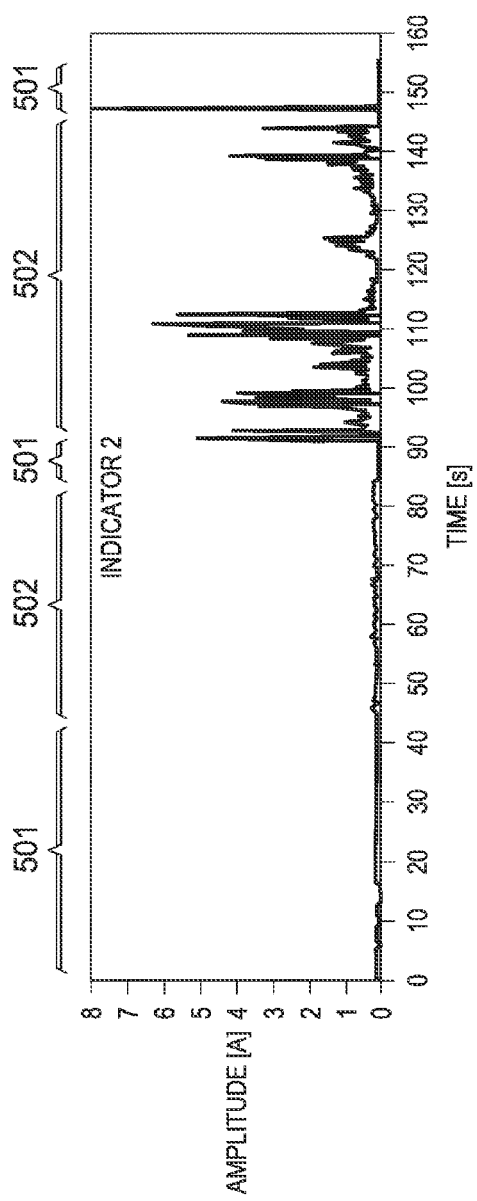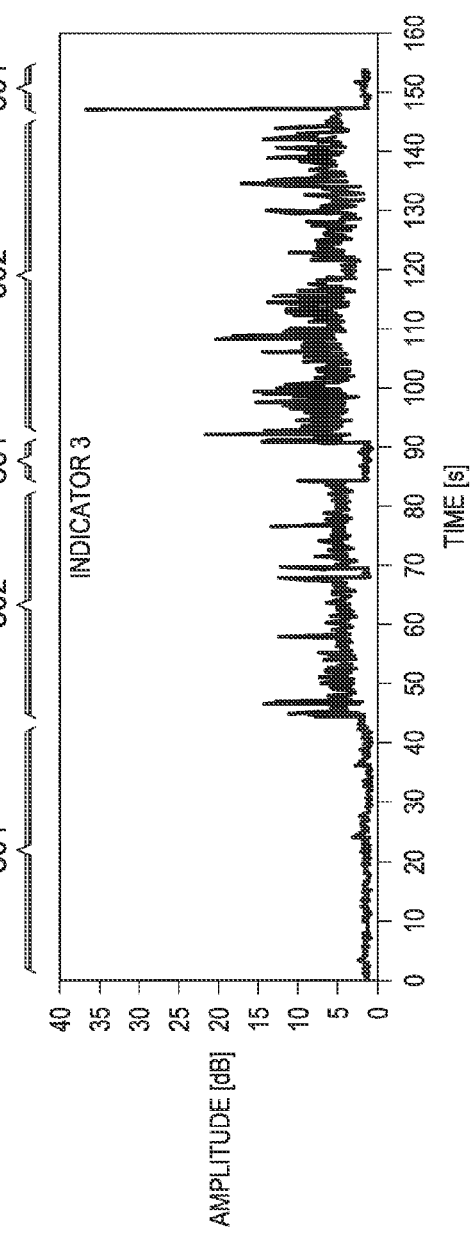

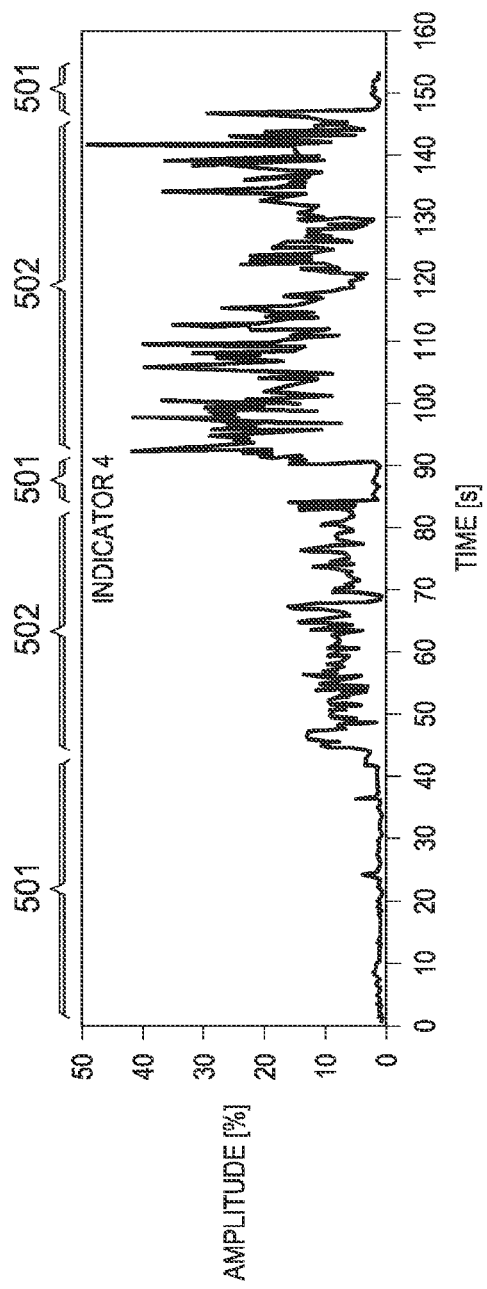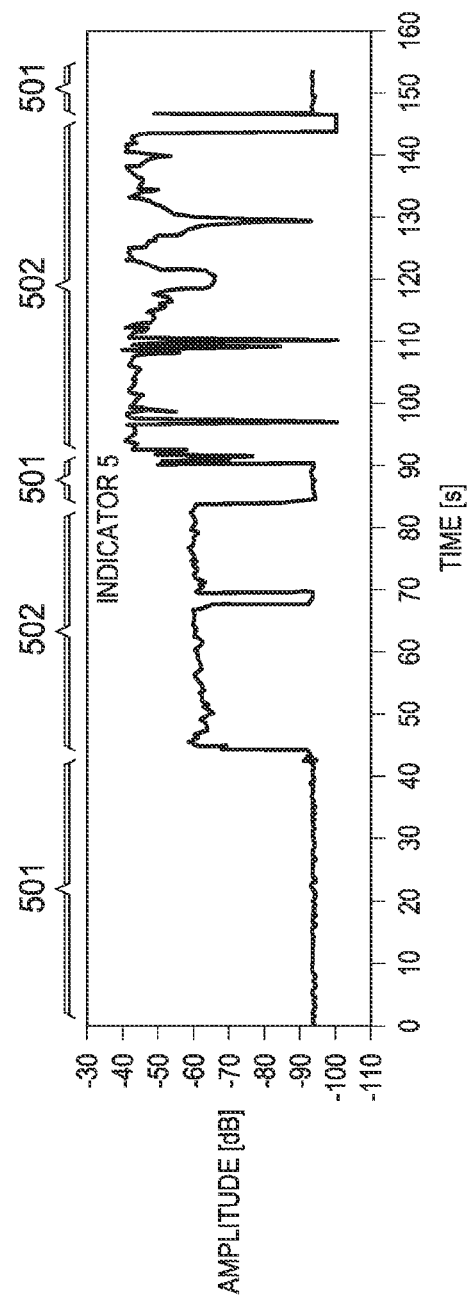

though commonly visible to those skilled in the art. The present invention is now made to FIG. 1A which illustrates a
ARC FAULT DETECTION EQUIPMENT AND METHOD USING LOW FREQUENCY HARMONIC CURRENT ANALYSIS

TECHNICAL FIELD

The present invention relates to arc fault detectors.

BACKGROUND

Arcing is a luminous discharge of electricity across an insulating medium, usually accompanied by the partial volatilization of the electrodes. Arcing conditions commonly occur in many electric circuits; for example, several loads and components used in households are characterized by arcing conditions in their normal operation or they absorb currents whose waveforms are similar to the arcing current, but these arcs are not considered dangerous (these are referred to as "safe arcs" in the following). Some examples of these types of loads are vacuum cleaners, lamps controlled by snap switches or dimmers, electronic variable-speed electric hand-held shop tools, and electronic switch mode power supplies. On the other hand, harmful arcing conditions (referred to as "arc faults" in the following) may occur, due to aged or damaged wires, worn electrical insulation, wires or cords in contact with vibrating metal, overheated or stressed electrical cords and wires, or misapplied or damaged electrical appliances. In an electric circuit, the effects of the arc faults may pose a risk of fire ignition under certain conditions if the arcing persists. Arc faults can also occur in DC electric circuits, for example in electric vehicles, ships, aircrafts, photovoltaic plants, variable speed drives, and so on. If not promptly detected and extinguished, such arc faults could spread to adjacent circuits, endanger power sources and control systems, cause explosions and fire ignitions.

An arc fault is usually not detected by common circuit protection devices and breakers (thermal/magnetic or differential). Thus, arc fault circuit interrupters (AFCIs) have been introduced to protect against an arc fault. The AFCI operates to mitigate the effects of arcing faults by functioning to de-energize the circuit when the arc fault is detected.

Arc faults can be divided into two categories: parallel arc faults and series arc faults.

A parallel arc fault occurs between the line and neutral conductors (line-to-neutral fault) or even between a conductor and ground (line-to-ground or neutral-to-ground). In these cases the load is shortcut and the arcing current usually assumes values higher than the normal values for the electric circuit, being limited only by the source power and the circuit impedance. The detection of such a parallel arc fault is a rather straightforward issue because of the increase in current amplitude. In many cases, the current amplitude rises above the tripping threshold of the magnetic/thermal protection so that the parallel arc fault can be extinguished using the common circuit protection devices.

On the other hand, a series arc fault occurs in a single conductor due to damage present on that conductor. In most cases, the arc fault occurs in series with a load whose impedance reduces the amplitude of the arcing current to within the normal values for the electric circuit. Thus, current in the circuit will not rise to a level which trips common circuit protection devices. The recognition of a series arc fault and its discrimination against normal conditions can be very difficult, for example, this is the case with electric circuits, where loads producing "safe arcs" (i.e., "masking loads") are present in the circuit involved by the arc fault.

Reference is now made to FIG. 1A which illustrates a typical waveform of an arcing current and FIG. 1B which illustrates a typical waveform of a non-arcing current (both obtained for an AC electric circuit, in the presence of a resistive load). It will be noted from FIG. 1B that normal operation exhibits a current waveform having a sinusoidal shape. In the presence of a series arc fault condition, however, FIG. 1A shows that the sinusoidal shape has been disturbed. More particularly, the current waveform is characterized by a rate of rise in the arc current (see, reference 101) that is usually greater than that present with normal current (see, reference 102). Furthermore, in each half cycle, regions of no current flow, referred to in the art as "shoulders" (see, reference 103), are present in the current waveform ahead of each steep rise in current. These zero-current regions occur due to the fact that the arcing current extinguishes before a normal current zero crossing (104) and reignites with a certain delay following the zero crossing. Other arcing characteristics not explicitly shown in FIG. 1A, but known to those of skill in the art, include the following: the amplitude of current is generally lower in the presence than in the absence of an arc (because of the voltage drop across the arc); the current signal exhibits broadband high-frequency noise in the presence of an arc; and the arcing phenomenon is non-stationary and frequently sporadic (thus segments of arcing signal can be mixed together with segments of normal non-arcing current and also with zero-current periods).

One or more of the aforesaid arcing characteristics, which may be clearly visible in the case of a resistive load, can be hidden in the presence of loads producing "safe arcs". By this it is understood by those skilled in the art that current waveforms may look very similar to each other in the presence and in the absence of an arc fault, especially where the load is a masking load. Reference is now made to FIG. 2A which illustrates a typical waveform of an arcing current and FIG. 2B which illustrates a typical waveform for a non-arcing current (both obtained for an AC electric circuit, in the presence of a load including a dimmer with tungsten lamps). It will be noted that shape of the current waveform, for example in terms of amplitude, shoulder shape and shoulder presence (see, references 203 and 204) and rise time (see, references 201 and 202) are quite similar. The presence of the arcing condition in FIG. 2A can be quite difficult to detect in comparison normal operation in the presence of a masking load. Conversely, there is a risk of mistakenly detecting (a false positive detection) the presence of an arcing condition in FIG. 2B.

The prior art is replete with solutions for making arc fault detections. Generally speaking, the prior art solutions function to analyze the current signal (and in few cases also the voltage signal) with the aim to identify the above mentioned characteristics of an arc fault and to distinguish the presence of these conditions from normal conditions (even with respect to "safe arcs"). The prior art solutions for arc fault detection are essentially based on: the analysis of the shape of the current waveform and its first derivative (di/dt) to individuate typical arcing characteristics such as peaks, shoulders and high rates of rise; the analysis of the high frequency broadband noise present in the current waveform; and the analysis of the non-periodicity of the signal by means of cycle to cycle waveform comparison or comparison of the waveform to a reference waveform shape obtained from the observation of the signal in a number of prior cycles.

In order to improve detection operation, the prior art solutions typically make use of more than one of the detection methods, with the outputs combined and evaluated to make the detection decision. For example, an arc fault is not declared unless a number of arcing characteristics are simultaneously observed. This results in a reduced risk of unwanted trips or failures to trip.

The prior art solutions may further evaluate not only the first derivative of the current waveform but also on the second derivative.

It is further well known in the art to evaluate the high frequency components (from a few kHz to hundreds of kHz or even MHz) of the current waveform (and its derivatives) to recognize the presence of broadband noise and to discern the typical characteristics of an arcing current, such as the shoulders, the presence of peaks or rates of rise higher than a specified limits.

Further solutions combine the broadband noise information with the analysis of the fundamental component of the current, in order to detect the presence of the shoulders. In many cases filtering techniques are used for these purposes, since digital signal processing techniques would require high sampling frequencies in order to perform a correct measurement of the considered high frequency components.

Generally speaking, the arcing characteristics are detected by comparing the signal waveform with that of a typical arcing condition. This can be accomplished by means of a comparison of measured characteristics with predetermined thresholds. In many cases the current signal is converted into sequences of pulses generated when a predetermined arcing characteristic exceeds the predetermined threshold. The pulses are then counted up to a given threshold which is meant to identify the arcing condition. In other cases the pulses are used to charge a capacitor and in this case the threshold is a predetermined level of charge of the capacitor.

Reference is made to U.S. Pat. Nos. 5,682,101, 6,246,556 and 6,259,996 (the disclosures of which are incorporated by reference) which propose detection systems based on counting pulses (within a selected time interval) generated when a current rate-of-change signal exceeds selected thresholds in proper frequency ranges (where the frequency ranges are typical of arc faults).

Reference is also made to U.S. Pat. No. 5,839,092 (the disclosure of which is incorporated by reference) which proposes a detection system based on counting (within a selected time interval) the changes on slope of the current which are obtained by monitoring the peak currents in a series of half cycles of the waveform. In addition, current samples are normalized and self-correlated to detect waveform shape, with the number of significant waveform shape changes between consecutive half cycles being counted and evaluated to identify arc faults.

Reference is further made to U.S. Pat. No. 7,068,480 (the disclosure of which is incorporated by reference) which proposes analysis of the di/dt signal to determine the presence of broadband noise in a predetermined range of frequencies, as well as the presence of current peaks and high rates of rise. The arc fault detection is made by comparing such characteristics with predetermined values which are related to the arcing condition and to the load recognition.

U.S. Pat. No. 5,185,684 (the disclosure of which is incorporated by reference) proposes a current sensing solution where the arc detection system includes a frequency responsive circuit (with a number of band pass filters, essentially in the broadband noise frequency range) for sensing the electromagnetic field generated by the current signal. A plurality of frequencies are monitored in combination for information indicative of the presence of an arc fault.

In U.S. Pat. Nos. 5,452,223 and 5,561,605 (the disclosures of which are incorporated by reference), a harmonic notch filter samples current at a plurality of phases and cycles, and differences between two sampled currents are processed in a synchronous summer over a number of cycles. The arc fault is detected by evaluation of given conditions of the cumulative current difference signal provided by the summer.

With reference to U.S. Pat. Nos. 5,691,869 and 5,963,405 (the disclosures of which are incorporated by reference), arc fault detection is made by analyzing the waveform and amplitude of the current. A filter generates pulses whose amplitude is proportional to the amplitude of the step increase in current generated by the striking of the arc. The pulses are rectified and, when exceeding a given threshold, they are integrated by an RC circuit, which generates a trip signal when the charge voltage of the capacitor exceeds a predetermined threshold.

In U.S. Pat. No. 5,805,397 (the disclosure of which is incorporated by reference), an arc fault is detected by means of a multi-channel system using non-overlapping band pass filters generating outputs responsive to white noise produced by the arc fault. The filter outputs are logically combined by comparator circuitry with common pull-up resistors or by analog multipliers to producing the trip signal for the breaker.

Referring now to U.S. Pat. No. 5,815,352 (the disclosure of which is incorporated by reference), an arc fault detector includes a pulse generator which provides a pulse each time an arc is struck. When a time attenuated accumulation of pulses reaches a predetermined threshold, the trip signal is produced. A limiting amplifier limits the amplitude of the pulses to discriminate against false trips.

In U.S. Pat. No. 5,818,237 (the disclosure of which is incorporated by reference), a signal conditioner generates a bandwidth limited di/dt signal having pulses produced by current step increases. A first circuit tracks the envelope of the di/dt signal with a first time constant and a second circuit tracks the di/dt envelope with a shorter time constant. The arc fault is detected when the second tracking signal falls to a predetermined fraction of the first tracking signal.

U.S. Pat. No. 5,835,321 (the disclosure of which is incorporated by reference) teaches a band-pass filter used to generate an arcing current signal having a bandwidth of about 3 kHz to 20 kHz. For each cycle that the arcing signal exceeds a threshold, preferably related to the AC current amplitude and for a selected duration of the cycle, a fixed pulse is generated. If a time attenuated accumulation of these fixed pulses reaches a predetermined level, the arc indicative signal is produced.

U.S. Pat. No. 6,388,849 (the disclosure of which is incorporated by reference) teaches an arc fault detector including an average instantaneous current generator that averages the current over the fundamental period and produces an output indicative of an arc fault when substantial variations in the current waveform are present between half-cycles. To discriminate over inrush currents, a pulse generator produces a pulse in response to step increases of the current caused by an arc striking. An output circuit generates an arc fault signal when the time attenuated accumulation of pulses occurring in half-cycles, in which the average instantaneous current is above a selected threshold, reaches a predetermined level.

Other prior art solutions are based on the analysis of typical frequencies and characteristics related to the arcing current.

For example. U.S. Pat. No. 5,706,159 (the disclosure of which is incorporated by reference), teaches an arc fault detection system including two swept filters and associated amplifiers which produce a signal whose amplitude is representative of high frequencies (of about few Mhz to around 20 Mhz) present in an arcing current. The portion of the filtered signal having an amplitude above a predetermined value is integrated and the trip signal is produced when the integration exceeds a predetermined limit.

In U.S. Pat. No. 5,729,145 (the disclosure of which is incorporated by reference), arc fault detection is based on an analysis of wideband high frequency noise which exhibits distinctive patterns of variation in amplitude synchronized to the gaps (shoulders) in the power waveform.

With reference to U.S. Pat. No. 6,031,699 (the disclosure of which is incorporated by reference), arc fault detection is based on a simultaneous analysis of current peaks and variations. A level detector generates a first pulse when the current exceeds a first level and a step detector generates a second pulse when a rapid step increase of the current exceeds a second level. The first and second pulses are combined and an arc fault is generated when the combined pulses exceed a third level.

U.S. Pat. Nos. 7,110,864 and 7,307,820 (the disclosures of which are incorporated by reference) combine a number of the aforesaid solutions to examine a plurality of arcing events related to the amplitude-duration pair or to the broad-band signal current characteristics.

Other proposed solutions for arc fault detection are based on methods of frequency analysis of the di/dt signal. For example, U.S. Pat. No. 6,198,611 (the disclosure of which is incorporated by reference) teaches passing the di/dt signal through a high pass filter to attenuate the fundamental current component. The filtered signal is then integrated and a trip signal is produced if the integrated signal exceeds a threshold level. A current transformer is used to sense the di/dt signal. The current transformer saturates at a predetermined current level to discriminate signals with normal and high di/dt.

In U.S. Pat. No. 6,362,628 (the disclosure of which is incorporated by reference), a pulse width modulation (PWM) technique is used to detect the broadband noise associated with the arcing current. A logic signal is created having a duration or width corresponding to the time intervals during which broadband noise is present. The random starts and stops of the arc fault modulate the width of the logic pulse with respect to the current zero crossing. A microprocessor monitors the PWM logic pulse and increments a counter when a difference between two consecutive pulse lengths exceeds a predetermined amount. If the counter reaches a predetermined value, associated with the arc current amplitude, the trip signal is produced.

U.S. Pat. No. 7,227,729 (the disclosure of which is incorporated by reference) teaches making an arc fault detection based on an analysis of both the current and its derivative characteristics. The high frequency components of the input current are processed to detect the peak, rms and/or average values of the current. Moreover, the input current is filtered and rectified and the di/dt characteristics are obtained. A processing unit correlates the absolute current and the di/dt characteristics to distinguish between arc faults and nuisance loads.

With reference now to U.S. Pat. No. 6,088,205 (the disclosure of which is incorporated by reference), the arc fault detection is made based on an analysis of both the line frequency component and the high frequencies components of the current. The line frequency component provides an indication of the amount of the input current. The high frequency components are indicative of the level of arcing. If the average high frequency signal is grater that the level expected for a normal appliance arcing at the associated average line frequency level, then the trip signal is generated.

With further reference to U.S. Pat. No. 6,972,572 (the disclosure of which is incorporated by reference), the arc fault detection is made by analyzing the peak values of the di/dt signal using a peak detector with decay.

U.S. Pat. No. 7,003,435 (the disclosure of which is incorporated by reference) teaches an arc fault detection made based on a simultaneous evaluation of different characteristics of the current. Apart from the current waveform, two pulse signals are obtained for each occurrence of positive or negative step changes in the current with di/dt values higher than a predetermined value. Moreover, the broadband noise level in the current and the zero crossings is analyzed. A microcontroller compares these characteristics to determine whether the arc fault is present.

U.S. Pat. No. 7,062,388 (the disclosure of which is incorporated by reference) teaches a frequency harmonic identifier that detects series arcs using a Fast Fourier Transform (FFT) based technique to provides the harmonic content of the sensed current signal. Reference information relating to a variety of common loads is stored. Circuit logic functions to compare the sensed harmonic content to the reference information. In the absence of a match, a series arc fault signal is generated.

Those skilled in the art will recognize a number of limitations and drawbacks associated with the foregoing solutions of the prior art. For example, although solutions are presented to distinguish arc faults from certain known safe arcs, these solutions continue to suffer from instances of false arc fault detection. Additionally, the commonly utilized broadband signal analysis for arc fault detection requires the use of analog circuit solutions, mainly based on filtering. Digital solutions would be preferred but are not satisfactory because of a required high sampling rate and signal processing frequency and a wide observation window on a stationary signal (due to the use of spectral analysis algorithms such as traditional FFT which provide improved spectral resolution) and this conflicts with the sporadic and non-stationary nature of the arcing phenomenon over a wide observation window. On the other hand, if the observation window is made small, the spectral resolution is poor. In the cases which employ a low frequency signal analysis, that analysis is typically applied to the derivative of the current signal (di/dt) or it is used to fix some thresholds for the di/dt analysis and the discrimination of the arcing conditions against good arcs. In other cases, the low frequency analysis is used to compare the harmonic content of the current with predetermined reference signal bands, which may represent common loads. This solution requires a priori knowledge of the electric circuit, in each and every working condition, in order to determine the reference signal bands representing the possible load configurations. Furthermore, signal acquisition it typically accomplished using current transformers which may have a poor frequency response and a low signal-to-noise ratio. Better results may be obtained with shunts.

In spite of numerous and varied solutions for make an arc fault detection, there remains a need in the art for an improved arc fault detection circuit and method.

SUMMARY

In an embodiment, an arc fault detection circuit and method analyzes indicators obtained from low frequency spectral analysis of a current signal in a predetermined fashion to reliably detect the presence of arcing conditions. The low frequency spectral analysis is focused on frequency components up to a few hundreds of hertz or a few kilohertz. The indicators include the presence and the behavior of significant harmonics in a predetermined range of frequencies in the low frequency spectrum.

Both frequency processing and time domain processing are performed. The low frequency spectral analysis of the current signal is carried out in some consecutive observation windows using a high resolution algorithm for spectral analysis. The time-domain analysis of the current signal is performed to determine changes in the current waveform in the same consecutive observation windows used for the low frequency spectral analysis.

The solution monitors and collects the values of the indicators in the consecutive observation windows and checks for predetermined conditions to determine the behavior of the indicators in the observation windows. The results of the aforesaid analyses are monitored and collected during some subsequent observation windows, which are multiples of the observation window for the spectral analysis. The results are processed in a predetermined fashion to determine whether the arc fault is present in the circuit.

The equipment used for the solution includes: a current sensing circuit using a proper transducer unit and signal conditioning unit, a sample-hold unit, an analog-to-digital conversion circuit, a processing circuit of the acquired samples which implements the method for the arc fault detection and generates an arc fault signal, and a tripping unit which de-energizes the electric circuit in response to receipt of the arc fault signal.

In accordance with an embodiment, a circuit and method are presented for the detection of arc faults in electric circuits. The detection includes the ability to distinguish an arc fault condition from a safe arc associated with normal operating conditions even in the presence of a masking load. The detection further includes the analysis of a number of indicators derived from the analysis current signal, wherein the indicators are processed in a predetermined fashion to reliably detect the presence of arcing conditions.

In an aspect, an arc fault detection is made by performing a low frequency spectral analysis of the current signal to determine the presence and the behavior of significant harmonics in a predetermined range of frequencies, up to few hundreds of hertz or few kilohertz. The analysis is carried out in some consecutive and short-time observation windows, using an appropriate high resolution algorithm for spectral analysis. In contrast to prior art spectral analysis solutions which rely on typical FFT (or similar traditional algorithms), the present solution instead utilizes a high resolution spectral analysis algorithm which provides for a good spectral resolution even with a low sampling frequency and a short observation window. For example, the Chirp-Z Transform (CZT) may be used. However, other algorithms and techniques for spectral analysis may be used which to achieve the suitable resolution.

In accordance with another aspect, a time-domain analysis of the current signal is also performed to determine the changes in the current waveform. In contrast to prior art techniques, the time domain analysis is not based on a comparison of the waveforms from cycle to cycle or with a reference shape, but is instead performed in the same consecutive short-time observation windows that were used for the spectral analysis.

In accordance with another aspect, the results of the frequency domain and time domain analyses are monitored in some consecutive and short-time observation windows and collected during a long-time observation window, which is a multiple of the short-time observation window. The results are processed in a predetermined fashion to determine whether the arc fault is present in the circuit.

The implementation for arc fault detection advantageously requires only a simple data acquisition and processing system, such as a sampling and analog-to-digital conversion unit and a microcontroller or FPGA system to perform the signal processing operations. The low frequency spectral analysis technique permits the adoption of low sampling frequencies. Suitable frequency resolution is obtained by using a spectral analysis algorithm that allows for a high frequency resolution even with short time observation windows and low sampling frequencies. In an embodiment, the Chirp-Z Transform (CZT) may be used. Alternatively, other algorithms and techniques for spectral analysis known to those skilled in the art may be used.

In accordance with an aspect, an fault detection circuit may comprise: a transducer unit and a signal conditioning unit configured to sense the current signal; a sample-hold unit; an analog-to-digital (A/D) conversion unit configured to process the sensed and sampled current signal (wherein the conditioning unit adapts the sensed signal to the input range of the analog-to-digital conversion unit without introducing distortion); a processing unit configured to process the acquired samples of the sensed current signal and implements a method for arc fault detection, the processing unit comprising a digital system (such a microcontroller or a FPGA system); a tripping unit configured to de-energize an electric circuit in response to an arc fault detection.

BRIEF DESCRIPTION OF THE DRAWINGS

A more complete understanding of the present invention may be obtained by reference to the accompanying drawings wherein:

FIG. 2A illustrates a typical waveform of an arcing current;
FIG. 2B illustrates a typical waveform for a non-arcing current;
FIG. 3 is a block diagram of an arc fault circuit interrupter (AFCI);
FIG. 4 illustrates the general operating principle of the arc fault detection methodology performed during each long-time observation window;
FIGS. 6B-6F illustrate the amplitudes of indicators over time for the sampled current of FIG. 6A.

DETAILED DESCRIPTION OF THE DRAWINGS

Figure 1A:
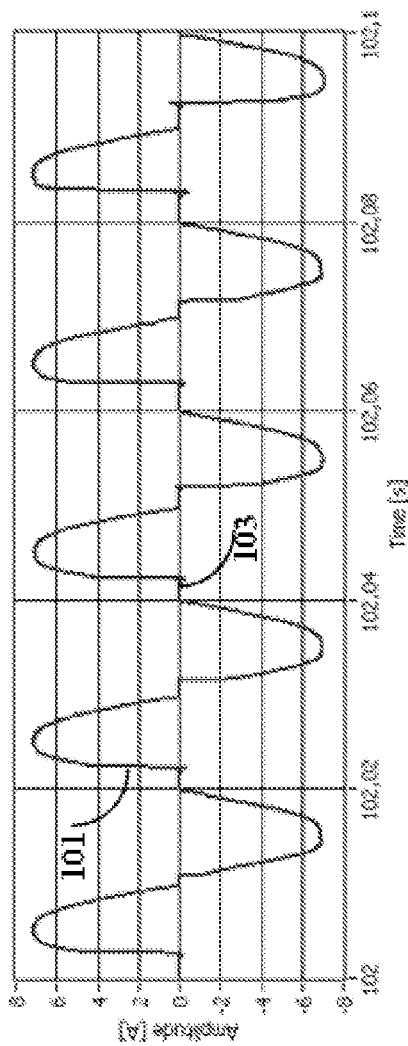
FIG. 1A illustrates a typical waveform of an arcing current.
Figure 1B:
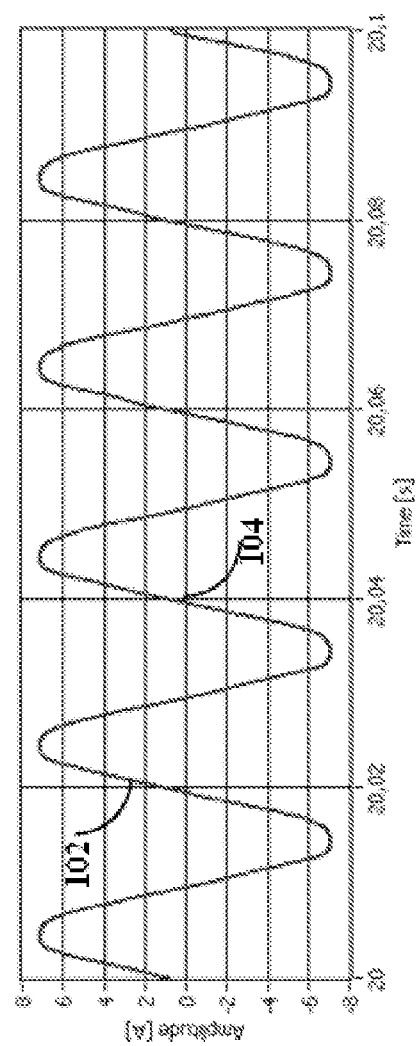
FIG. 1B illustrates a typical waveform of a non-arcing current.

Reference is now made to FIG. 3 which illustrates a block diagram of an arc fault circuit interrupter (AFCI) 600 implementing an arc fault detection method and process. The AFCI 600 is connected to a conductor line 607 to protect the line from arc faults.

Current on the conductor line 607 is sensed by means of a current transducer 601 coupled in series with a signal conditioning unit 602. The current transducer 602 may be implemented using any suitable technology, and in a preferred implementation the current transducer comprises a Hall-effect type of sensing circuit or current shunt circuit that is coupled to the conductor 607. The signal conditioning unit 602 may be implemented using any suitable technology, and in a preferred implementation the signal conditioning unit comprises an antialiasing filter, one or more signal amplifiers and one or more signal attenuators. Combined together, the current transducer 601 and signal conditioning unit 602 function to sense the current signal and adapt the range of the sensed current signal to a desired analog output range. The current transducer 601 and signal conditioning unit 602 have a frequency response selected to avoid introducing distortion on the sensed current signal.

The AFCI 600 further comprises a sample and hold unit 603 having an input coupled to an output of the signal conditioning unit 602. The sample and hold unit 603 functions to sample the analog output of the signal conditioning unit 602 with a relatively low sampling frequency. For example, the sampling frequency is at or about a few tens of kilohertz. In an alternative implementation, the sampling frequency is at or about a few kilohertz. In a preferred implementation, the sampling frequency is selected between 1 kHz and 30 kHz, and is more preferably selected to be 10 to 12 kHz for a fundamental frequency of 50-60 Hz. The goal of such sampling is to obtain samples suitable for low frequency spectral analysis of frequency components of the current signal conductor 607, said frequency components being in the range of 0 Hz to 500-600 Hz (with the high end of the range being at or about an order of magnitude greater than the fundamental frequency of the analyzed current signal for example of 50 or 60 Hz).

The output of the sample and hold unit 603 is coupled to the input of an analog-to-digital (A/D) conversion unit 604. The A/D conversion unit 604 functions to convert the sensed and sampled analog current signal to multi-bit digital sample values representative of that current. The sample-hold unit 603 and A/D conversion unit 604 accordingly support sampling of the sensed current signal with a relatively low sampling frequency (less than, for example, a few tens of kilohertz) that is well suited for supporting performance of a low frequency spectral analysis in making an arc fault detection decision.

The AFCI 600 further comprises a processing unit 605 coupled to receive the digital sample values for sensed line current. The processing unit 605 may comprise a microcontroller or microprocessor device. Alternatively, the processing unit 605 may comprise a field programmable gate array (FPGA) circuit. In either case, the processing unit 605 is configured to digitally implement an arc fault detection methodology, to be described in more detail, which is based at least in part on a low frequency harmonic analysis of the sensed line current over one or more analysis windows. The processing unit 605 receives the digital sample values for sensed line current and applies the arc fault detection methodology to those values. The processing unit 605 is further configured to generate and output an arcing/nonarcing signal indicative of whether the process of the arc fault detection methodology has detected the existence of an arc fault on the conductor line 607. In an implementation using a microcontroller or microprocessor, the processing unit 605 will include an executable program specifying the details of the arc fault detection methodology. In an implementation using an FPGA, the processing circuit 605 will have its gate array configured to perform the requisite signal processing actions to effectuate the arc fault detection methodology.

A tripping unit 606 is configured to selective de-energize the electric circuit of the conductor line 607 in response to the output signal of the processing unit 605 indicating the presence of an arc fault. The tripping unit has a normally-closed circuit configuration. Responsive to the output signal indicating the presence of an arc fault, the normally-closed circuit configuration is tripped to an open circuit configuration so as to disconnect the load (and the arc fault) from the power supply. The tripping unit is conventionally manually reset to the normally-closed circuit configuration.

Reference is now made to FIG. 4 which illustrates the general operating principle of the arc fault detection methodology during each observation window.

The process begins at step 301 with the acquisition (i.e., receipt) of the samples of the conductor line current by the processing unit. The number of samples received for analysis depends on the length of the observation window (that length being a function of the number of cycles of the current waveform under evaluation). In step 302, the samples are processed in order to make a measurement one or more indicators that are used for making an arc fault detection. Each of those indicators has a related threshold (or setting) that is set to an initial value. For a first observation window, the related threshold values may be default values (for example, the expected values for the indicators in the normal operation of the electric circuit). For second and further observation windows, however, the threshold values may depend on the results of comparison operations (see steps 303 and 307 to be described in detail), and thus may be tailored to more accurately represent the actual circuit load configuration.

In step 303, a first comparison is made between each measured indicator in a first group of indicators and its corresponding threshold value. If the results of the comparisons are positive (step 304), this is indicative that the difference between each measured indicator of the first group and its corresponding threshold value is within a predetermined limit. With this result, a conclusion is reached that no arcing condition has been detected. Responsive thereto, each threshold value may be updated in step 305 to a new value, and the process repeats for a next observation window. The new threshold value may be selected as a function of the related measured indicator. On the contrary, if the results of at least one of the comparisons is negative (step 306), this is indicative that the difference between one or more measured indicators of the first group and its corresponding threshold value is out of the predetermined limit. With this result, it is possible that an arcing condition is present. The threshold values are maintained at their current values (previously set for use in the current observation window), the process moves on to step 307.

It will be noted that in the first comparisons of step 303, all of the comparisons performed should be positive in a preferred implementation in order to proceed at step 304. If the comparison of step 303 produces a mixed result (one or more positives and one or more negatives), the possibility exists for either a potential arcing condition or a change in load conditions, and the process moves to step 306. The additional analysis of the second comparisons is then performed at step 307.

In step 307, a second comparison is made between each measured indicator in a second group of indicators and its corresponding threshold value. If the results of the comparisons are positive (step 308), this is indicative that the difference between each measured indicator of the second group and its corresponding threshold value is within a predetermined limit. With this result, a conclusion is reached that no arcing condition has been detected. Responsive thereto, each threshold value may be updated in step 309 to a new value, and the process repeats for a next observation window. The new threshold value may be selected as a function of the related measured indicator. On the contrary, if the results of the comparisons are negative (step 310), this is indicative that the difference between each measured indicator of the second group and its corresponding threshold value is out of the predetermined limit. With this result, an arcing condition is detected and the arcing/nonarcing signal is set to a state indicating the detected arc fault. Additionally, the threshold values are maintained at their current values (previously set for use in the current observation window). The process then repeats for a next observation window.

It will be noted that in the second comparisons of step 307, a majority of the comparisons performed should be positive in a preferred implementation in order to proceed at step 308. If the comparison of step 307 produces a mixed result (one or more positives and one or more negatives) with less than a majority of positives, this would be indicative of an arcing condition, and the process moves to step 310. Conversely, a majority of the comparisons performed should be negative in a preferred implementation in order to proceed at step 310. If the comparison of step 307 produces a mixed result (one or more positives and one or more negatives) with less than a majority of negatives, this would be indicative of a changing load condition, and the process moves to step 308.

It will be understood that in the next observation window each indicator will have a related threshold that is set by steps 305, 307 and/or 311. The change in threshold is described herein.

The measured indicators used for the analysis are derived from a low frequency spectral analysis of the digital sample values for sensed line current and a time domain analysis of the digital sample values for sensed line current. For example, the first comparisons of step 303 may comprise the comparison of low frequency spectral analysis indicators to corresponding threshold values while the second comparisons of step 307 may comprise the comparison of time domain analysis indicators to corresponding threshold values. Conversely, time domain analysis indicators may be processed in step 303 while low frequency spectral analysis indicators are processed in step 307. Still further, a mixture of low frequency spectral analysis indicators and time domain analysis indicators may be considered in each of steps 303 and 307.

The process of FIG. 4 is performed for each observation window. The observation window may comprise either a long-time observation window or a short-time observation window. In this context, each observation window is equal to, in the case of an AC circuit, a predetermined number of cycles of the current waveform or, in the case of a DC, to a predetermined time of observation, that are sensed and sampled. For example, in an AC circuit, for a long-time observation window the predetermined number may comprise a few tens of cycles, such as 10-40 cycles, while in a short-time observation window the predetermined number may comprise fewer cycles, such as 2-10 cycles. Furthermore, the predetermined number of cycles in the short-time observation window is preferably a sub-multiple of the predetermined number of cycles in the long-time observation window. As an example of this sub-multiple relationship, there may comprise x cycles in the long-time observation window and y cycles in the short-time observation window (with x=ny, with a specific and non-limiting implementation where x=20, n=5 and y=4). One long-time observation window may include a plurality of short observations windows.

The digital sample values of sensed line current within a given observation window are processed in a predetermined fashion to make a measurement of a given indicator within a set of indicators. The indicators are then evaluated within the arc fault detection process. Specific details of the indicator calculation and evaluation in comparison to the threshold values will be provided below.

In connection with indicators derived from the low frequency spectral analysis of the digital sample values for sensed line current, a preferred implementation utilizes the Chirp-Z Transform (CZT) known to those skilled in the art (see, Aiello, et al., "Synchronisation techniques for power quality instruments", IEEE Transactions on Instrumentation and Measurement, Vol. 56, No. 5, October 2007, pages 1511-1519, the disclosure of which is incorporated by reference) to calculate the low frequency spectrum of the sensed and sampled current signal for analysis in each observation window. It will be understood, however, that other spectral analysis algorithms coupled alternatively be used to obtain a low frequency current spectrum with good spectral resolution, provided the algorithms are operable on data obtained at the reduced sampling rate of the sample and hold unit 603 and analog-to-digital (A/D) conversion unit 604 of FIG. 3.

With respect to the Chirp-Z Transform, it has an advantage over Fast Fourier Transform (FFT) in that a higher resolution may be obtained considering the same observation window and focusing the analysis in a narrower portion of the signal spectrum. The CZT may be expressed as:

$$X_C = \sum_{n=0}^{N-1} x_n A^{-n} W^{nk}$$

$$k = 0, 1, \ldots, (M-1)$$

Where:

$$W = W_0 e^{-j\Phi_0}, A = A_0 e^{j\theta_0}$$

Wherein $A_0$ and $W_0$ are positive real numbers.

Given $A_0 = W_0 = 1$ and writing $\Phi_0$ and $\theta_0$ as a function of: the sampling frequency $f_s$, the number of samples N and the range of observation $f_w = [f_{min}; f_{max}]$, then the CZT gives the following frequency resolution:

$$\Delta f_{CZT} = \frac{f_w}{N}$$

If $T_w = 80$ ms ($f_s = 10$ kHz, N=800 points) and $f_w$ ranges from 0 Hz to 500 Hz, then the spectral resolution $\Delta f_{CZT} = 0.625$ Hz for the Chirp-Z Transform. Conversely, for the same evaluation, the spectral resolution for an FFT would be $\Delta f_{FFT} = 12.5$ Hz.

The CZT algorithm presents only an example of a suitable transformation implementation. Any transformation technique which provides better resolution than FFT could be considered for use in the present embodiments.

Some indicators may be obtained from a measured difference between two low frequency spectra associated with different, and more particularly consecutive, observation windows. In this context, it is preferred that the two observation windows each be of the short-time type. The measured difference indicator provides information indicative of non-stationary behavior of the current signal waveform. Where the measured difference indicator assumes a small (ideally nil) value less than a set small threshold value, a conclusion may be reached that the signal is stationary. On the other hand, if the measured difference indicator exceeds the set threshold, a conclusion may be reached that the signal is non-stationary.

An exemplary and non-limiting example of an algorithm for the calculation of a possible difference indicator between two low frequency spectra associated with different, and more particularly consecutive, observation windows uses the following formula:

$$DFS = \frac{1}{N}\sum_{i=1}^{N}(FS_{i\_1} - FS_{i\_2})$$

In the example, DFS is the foregoing exemplary indicator, $FS_{i\_1}$; and $FS_{i\_2}$ are the ith corresponding values of low frequency spectra measured in two different, and more particularly consecutive, observation windows, and N is the number of points of each low frequency spectrum.

The foregoing algorithm measures the non-stationary characteristic of the signal calculated as the mean value of the frequency transform point to point differences between two consecutive observation windows. Where the signal is stationary, the calculated indicator assumes a very low value (typically zero). Conversely, if the signal is non-stationary, the value of the calculated indicator increases.

Other low frequency indicators may be obtained from determining a difference between maximum values of low frequency spectra associated with different, and more particularly consecutive, observation windows. Preferably, the maximum values at issue concerning frequency components in the low frequency spectra that surround (within a given frequency offset) the central value of a low frequency harmonic which is an integer multiple of the fundamental frequency of the current signal. Multiple harmonics may be considered. The presence of such harmonics may depend on load conditions as well as the presence of an arcing condition. In some load conditions, the harmonics may represent typical harmonics that are present in arc fault conditions but otherwise not present with respect to conventional operation of the electric circuit in the absence of an arc. Thus, the detection of such harmonics would be indicative of an arc fault. Conversely, the harmonics may represent typical harmonics that are present both in the presence and absence of an arc fault. However, in a masked load conditions the harmonics are stationary and assume low amplitude values, while in an arc fault condition the harmonics may be non-stationary and have high amplitude values. Evaluation of harmonic movement and amplitude relative to certain thresholds will accordingly provide information indicative of the presence of an arc fault.

An exemplary and non-limiting example of an algorithm for the calculation of a possible difference indicator between maximum values of low frequency spectra associated with different, and more particularly consecutive, observation windows uses the following formula:

$$DHFS = (HFS_1 - HFS_2)$$

DHFS is the foregoing exemplary indicator; $HFS_1$ and $HFS_2$ are the maximum values of the low frequency spectra, measured in two different, and more particularly consecutive, observation windows, in the frequency range $(f_h \pm \Delta f)$; where $f_h$ is the given harmonic frequency, which is an integer multiple of the fundamental frequency of the current signal; and $\Delta f$ is the frequency offset that surround the central value $f_h$.

In connection with the foregoing, a number of maximum values of the frequency transform in a fixed frequency range around the harmonic of interest are calculated. Different calculations could be made relative to the extremes of the frequency range of interest around the harmonic. The calculations accordingly identify when spectral components around the harmonics of interest appear. The measurements for identical or similar ranges of interest in two different observation windows are then compared to produce the difference indicator.

Still other low frequency indicators may be obtained from determining the frequency components of the low frequency signal spectrum, other than at integer multiples of the fundamental frequency of the current signal (referred to as the non-harmonic frequency components of the low frequency signal spectrum), associated with different, and more particularly consecutive, observation windows. The measured indicator provides information indicative of non-stationary behavior of the current signal waveform. Where the measured indicator assumes a value less than a set threshold value, a conclusion may be reached that the signal is stationary. On the other hand, if the measured indicator exceeds the set threshold, a conclusion may be reached that the signal is non-stationary.

An exemplary and non-limiting example of an algorithm for the calculation of a possible indicator of the non-harmonic frequency components of the low frequency signal spectrum, other than at integer multiples of the fundamental frequency of the current signal, uses the following formula:

$$NFS = \frac{FS'}{N'}$$

Where NFS is the foregoing exemplary indicator, FS' is the sum of the values of the low frequency spectrum, other than those that surround (within a given frequency offset) the central value of the frequency harmonics in the spectrum which are integer multiples of the fundamental frequency of the current signal; and N' is the number of points of the low frequency spectrum, other than those that surround (within a given frequency offset) the central value of the frequency harmonics which are integer multiples of the fundamental frequency of the current signal. Thus, the points of the frequency transform without a harmonic component are identified and a mean value of those points presents the indicator.

Still other low frequency indicators may be derived from measured differences in the current waveforms sampled in different, and more particularly consecutive, observation windows. Preferably, the observation windows are of the short-time type. The observation windows may comprise the same windows considered in connection with the low frequency analysis described above. The measured difference indicator provides information indicative of non-stationary behavior of the current signal waveform. Where the measured difference indicator assumes a small (ideally nil) value less than a set small threshold value, a conclusion may be reached that the signal is stationary. On the other hand, if the measured difference indicator exceeds the set threshold, a conclusion may be reached that the signal is non-stationary.

An exemplary and non-limiting example of an algorithm for the calculation of a possible difference indicator between two current waveforms sampled in different, and more particularly consecutive, observation windows use the formula:

$$DCW = \frac{1}{N}\sum_{i=1}^{N}(CW_{i\_1} - CW_{i\_2})$$

In the example, DCW is the foregoing exemplary indicator; $CW_{i\_1}$ and $CW_{i\_2}$ are the ith current samples in two different, and more particularly consecutive, observation windows, and N is the number of samples of each current waveform in each observation window. The value of then indicator is indicative of the non-stationary behavior of the waveform.

Other low frequency indicators may represent a total amount of current of the electric circuit. Such an indicator may change when the load of the electrical circuit changes and furthermore may vary when the signal is non-stationary. Here, the measurement and analysis may be made with respect to a few to many observation windows (that may or may not be consecutive). The associated threshold is set accordingly to the amount over total current variation permitted/expected over time. If the measured total current indicator exceeds the set threshold, a conclusion may be reached that the signal is non-stationary.

Some exemplary and non-limiting examples of these types of indicators, representing the amount of current are: the root mean square value (rms) of the fundamental frequency component of the low frequency spectrum of the sampled current in the observation window, or the difference between such rms values in two subsequent observation windows.

Additionally, one or more of the aforesaid indicators that are measured in subsequent short-time observation windows may also be collected during one or more long-time observation windows (each long-time observation window includes a plurality of short-time observation windows). The indicators are then processed in a predetermined fashion in order to indicate the non-stationary behavior of the signal. It will be noted, however, that this processing should account for and thus exclude the cases in which the load changes in the normal operation of the electric circuit so as to avoid making a false arc fault recognition in the presence of a masking loads (a safe arc) while ensuring detection of an arc fault.

It will be understood that the long-time and short-time observation windows (LTW and STW, respectively) are not in contrast with each other; they may both be used in the arc detection method. The algorithm is the one described in the following, by means of the flow chart of FIG. 5.

Figure 5:
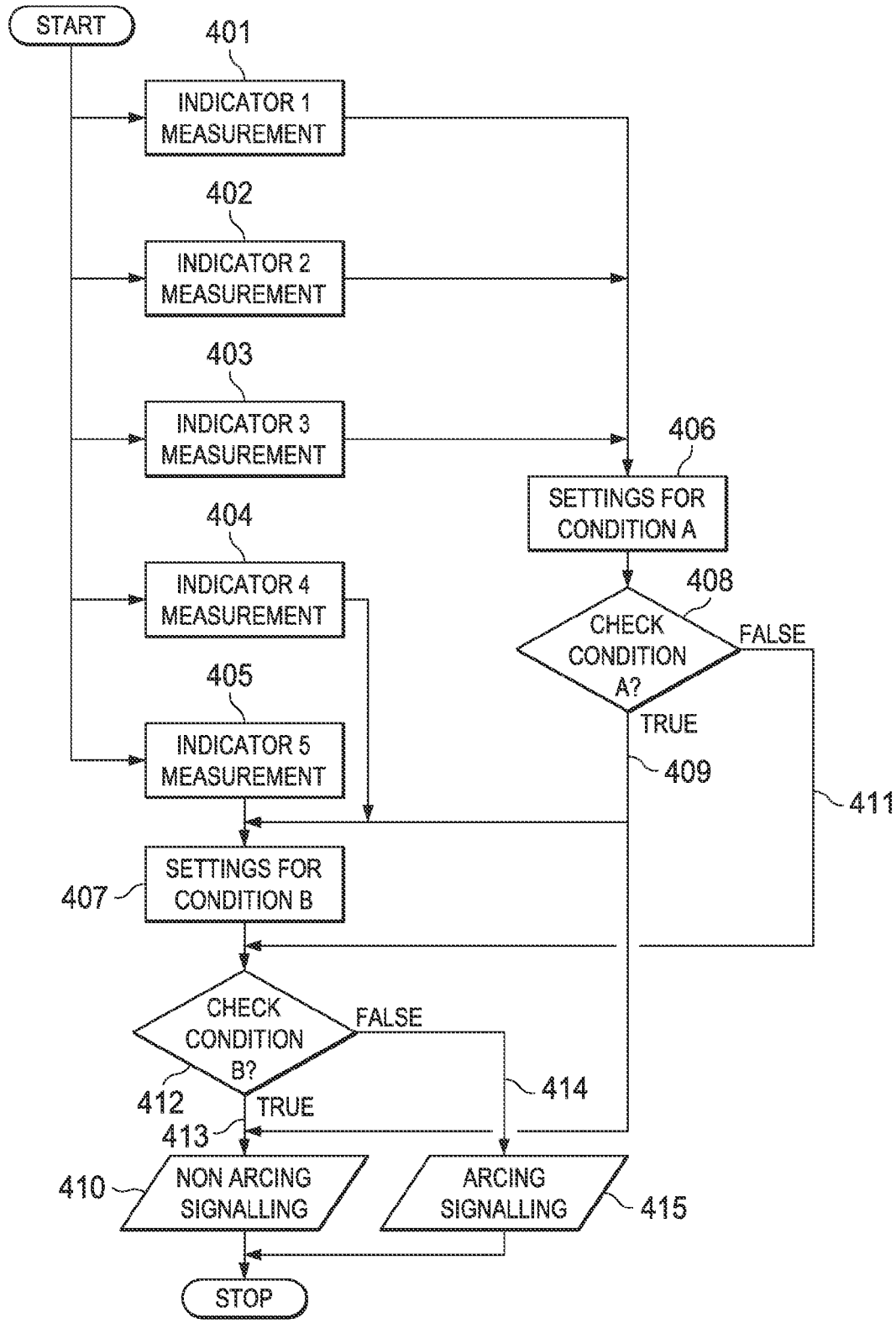
FIG. 5 illustrates a flow chart implementing an example of the operation of the arc fault detection methodology of FIG. 4 for a given observation window.

Reference is now made to FIG. 5 illustrates a flow chart implementing an example of the operation of the arc fault detection methodology of FIG. 4 for a given observation window. The example of FIG. 5 utilizes a mix of the indicators described above.

The process begins after the acquisition (i.e., receipt) of the samples of the current by the processing unit. The number of samples depends on the length of the observation window (that length being a function of the number of cycles of the current waveform under evaluation). For example, the observation window may be equal to a few tens of cycles of the current waveform for a long-time observation window (LTW). Alternatively, the observation window may be equal to a predetermined number n of cycles of the current waveform for a corresponding plurality of short-time observation windows (STWs), with each STW comprising a sub multiple number of cycles of the cycles of the LTW. For example, the number of cycles of the LTW may be set to 20 cycles of the current waveform, and n=5 STWs may be considered, with each STW having a duration of four cycles of the current waveform.

The digital sample values of sensed line current for the LTW and each of the STWs are processed in a predetermined fashion to measure a set of indicators (see, steps 401-405), and the indicators are evaluated (see, steps 408 and 412) in comparison to threshold values (see, steps 406 and 407) for the purpose of making an arc fault detection determination (see, steps 410 and 415). Examples of the calculation of indicators are provided above.

The exemplary implementation of FIG. 5 considers five different indicators. The first through third indicators are considered within a first group of indicators (FIG. 4, reference 303), and the fourth through fifth indicators are considered within a second group of indicators (FIG. 4, reference 307).

In accordance with the example of FIG. 5, the first indicator (i.e., indicator 1) 401 concerns the total amount of current of the electric circuit for the current waveform (for example, the difference between the fundamental RMS values in two consecutive observation windows), the second indicator (i.e., indicator 2) 402 concerns differences between the current waveforms sampled in two subsequent short-time observation windows (for example, the DCW calculation discussed above), the third indicator (i.e., indicator 3) 403 concerns differences in low frequency spectra for two subsequent short-time observation windows (for example, the DFS calculation discussed above), the fourth indicator (i.e., indicator 4) 404 concerns differences between the maximum values frequency components of the low frequency spectra for two subsequent short-time observation windows in a predetermined frequency interval around the central value of one or more predetermined low frequency harmonics which are integer multiples of the fundamental frequency of the current signal (for example, the DHF calculation discussed above), and the fifth indicator (i.e., indicator 5) 405 concerns differences in frequency components of the low frequency signal spectra (other than the harmonic components at integer multiples of the fundamental frequency of the current signal) for two subsequent short-time observation windows (for example, the NFS calculation discussed above).

The threshold values may alternatively be referred to as the conditions or settings of the indicators which are employed in the method herein disclosed for the arc fault detection. In a specific implementation, the settings in steps 406 and 407 for the conditions may comprise thresholds, limits or other parameters which are used to evaluate the behavior of the indicators. Such evaluated behavior in comparison to the settings provides an indication of whether the sampled current waveform is stationary and/or whether the sampled current waveform is experiencing an arc fault condition. The thresholds, limits of variation or other parameters may be set as a function of the measured indicators, which may assume different values depending on the load conditions and the arcing or non-arcing conditions. For example, they may be initially fixed to some default values, which may be referred to an ideal non arcing condition assumed valid for all types of loads. After consideration with respect to the first observation window, however, the thresholds may be updated to reflect the real load conditions in the manner described above. The consideration with respect to the next observation will then use the updated values. In this way, the thresholds, limits of variation or other parameters will be updated over the course of subsequent observation windows as the load of the electric circuit changes, and thus the system supports adaptation of the conditions of the indicators over time in response to variation in the real load condition of the electric circuit.

To avoid false arc fault detection during a first observation window due to the setting of the default values, which may be not suitable for making an evaluation against the real load condition, the arc fault detection determination of steps 410 and 415 may be disabled for at least the initial one or more cycles of the detection algorithm. This permits the methodology to adapt the thresholds, limits of variation or other parameters over one or more observation windows and thus better assure the making of an accurate arc fault determination in view of the real load conditions. The functionality of steps 408 and 412 to compare indicators to thresholds is thus used in the first one or more observation windows merely to ensure setting of the correct values for comparisons and not to make a determination of arc fault condition existence. This process advantageously addresses known deficiencies of prior art techniques. One prior art technique sets thresholds and limits independently of the respective parameters (i.e., independently from the load conditions). While this may work adequately for some types of loads, the setting process implemented by the prior art techniques may lead to false positive detections of an arc fault condition or alternatively to a failure to correctly detect an existing arc fault condition for certain types of loads. Other prior art techniques set thresholds and limits for a particular type(s) of load. While this solution works for the designed-to load configuration, the load-tailored detection operation may suffer from a failure to make an arc fault detection for other types of loads or falsely indicate an arc fault for a different load.

The conditions which are employed in example of FIG. 5 for arc fault detection include at least one condition corresponding to at least one indicator. For example, in a first group of indicators concern a first condition A (indicators 1, 2 and 3) and a second group of indicators concern a second condition B (indicators 4 and 5).

Condition A is checked in step 408 by comparing the measured indicators to their corresponding thresholds for the purpose of making a determination of a non-arcing condition or a potential arcing condition. In the example of FIG. 5, if the result of the check on condition A in step 408 is true (reference 409), then a non-arcing condition is detected and the non-arcing output signal is generated in step 410. Conversely, if the result of the check on condition A in step 408 is false (reference 411), then a potential arcing situation may be detected. To confirm the arcing situation, the process moves on to check condition B. Condition B is checked in step 412 by comparing the measured indicators to their corresponding thresholds for the purpose of making a determination of a non-arcing condition or an arcing condition. In the example of FIG. 5, if the result of the check on condition B in step 412 is true (reference 413), then a non-arcing condition may be detected and the non-arcing output signal is generated in step 410. Conversely, if the result of the check on Condition B in step 412 is false (reference 414), then the arcing condition may be detected and the arcing output signal is generated in step 415.

In connection with the foregoing, if the indicator 1 and indicator 2 checks are both false, but the indicator 3 check is true, for example, this is resolved as a potential arcing condition. The non-arcing condition is decided only if all comparisons with respect to the first group of indicators are true.

In connection with the foregoing, because a majority or better is required to make an arcing condition decision, both indicator 4 and indicator 5 must be true to conclude that there is a non-arcing condition. In a preferred implementation, an odd number of indicator could be included in the Condition B testing to ensure that the majority test will be satisfied.

Figure 6A:
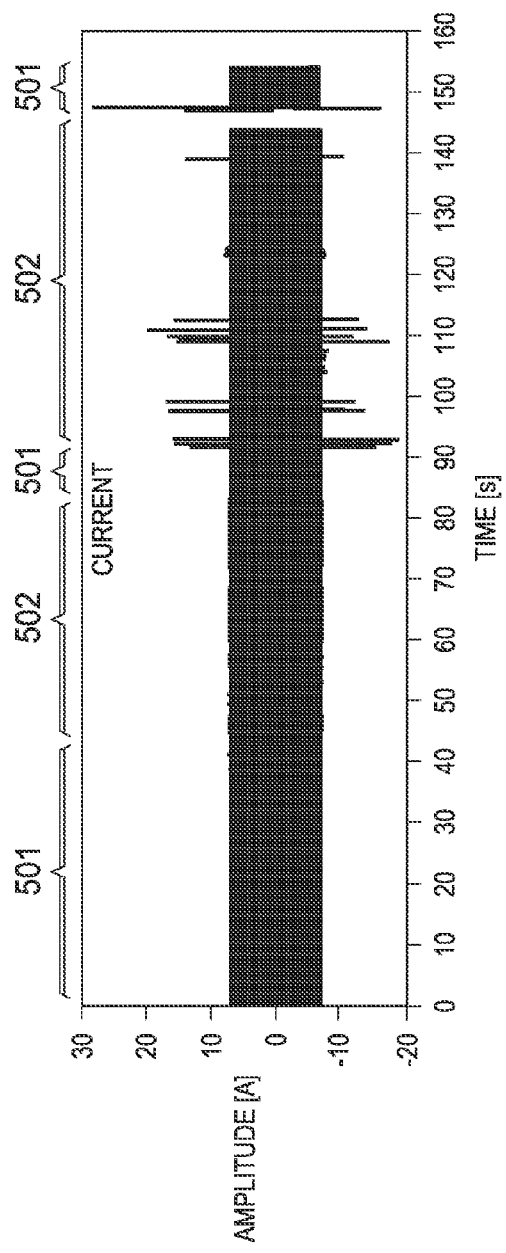
FIG. 6A illustrates the amplitude of sampled current over time in an exemplary implementation with a resistive load.

Reference is now made to FIG. 6A which illustrates the amplitude of sampled current over time in an exemplary implementation with a resistive load. The circuit is subject to non-arcing conditions at times associated with references 501 and arcing conditions at times associated with references 502.

Figure 6B:
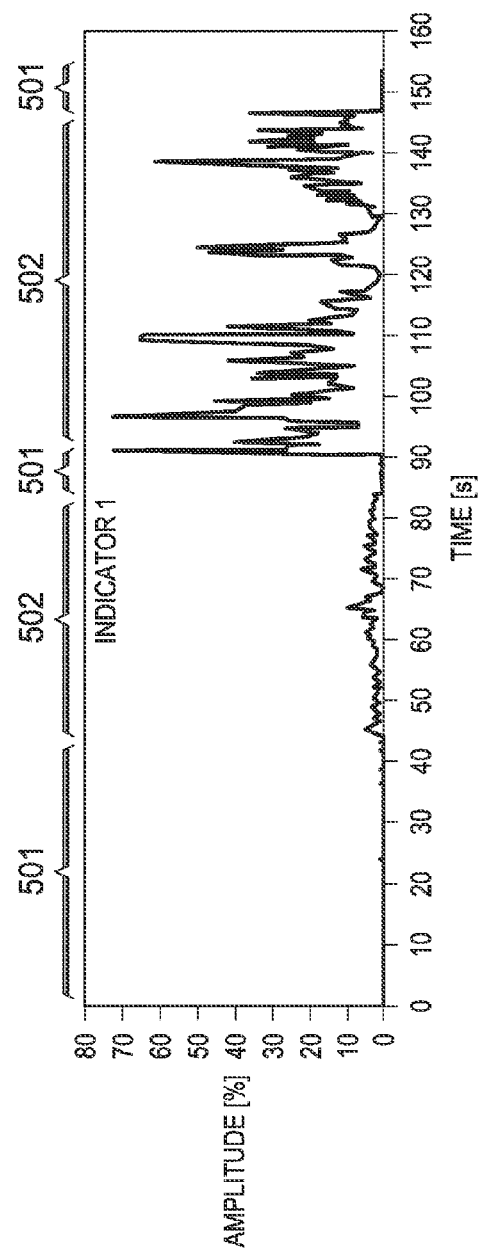

FIG. 6B illustrates the amplitude of indicator 1 over time for the sampled current of FIG. 6A. It will be remembered that indicator 1 (reference 401, FIG. 5) concerns the total amount of current of the electric circuit. The total amount of current indicator may change when the load of the electrical circuit changes and furthermore may vary when the signal is non-stationary. The measurement and analysis is preferably made with respect to a few to many observation windows (that may or may not be consecutive). The associated threshold is set accordingly to the amount over total current variation that is permitted/expected over time. If the measured total current indicator exceeds the set threshold, a conclusion may be reached that the signal is non-stationary. In FIG. 6B it will be noted that value of the indicator 1 is small to zero during time periods 501 associated with non-arcing conditions, and conversely is large during time periods 502 associated with arcing conditions.

FIG. 6C illustrates the amplitude of indicator 2 over time for the sampled current of FIG. 6A. It will be remembered that indicator 2 (reference 402, FIG. 5) concerns differences between the current waveforms sampled in two subsequent short-time observation windows. The difference in current waveforms indicator provides information indicative of non-stationary behavior of the current signal waveform. Where the measured difference indicator assumes a small (ideally nil) value less than a set small threshold value, a conclusion may be reached that the signal is stationary. On the other hand, if the measured difference indicator exceeds the set threshold, a conclusion may be reached that the signal is non-stationary. In FIG. 6C it will be noted that value of the indicator 2 is small to zero during time periods 501 associated with non-arcing conditions, and conversely is large during time periods 502 associated with arcing conditions.

FIG. 6D illustrates the amplitude of indicator 3 over time for the sampled current of FIG. 6A. It will be remembered that indicator 3 (reference 403, FIG. 5) concerns differences in low frequency spectra for two subsequent short-time observation windows. The difference in low frequency spectra indicator provides information indicative of non-stationary behavior of the current signal waveform. Where the measured difference indicator assumes a small (ideally nil) value less than a set small threshold value, a conclusion may be reached that the signal is stationary. On the other hand, if the measured difference indicator exceeds the set threshold, a conclusion may be reached that the signal is non-stationary. In FIG. 6D it will be noted that value of the indicator 3 is small to zero during time periods 501 associated with non-arcing conditions, and conversely is large during time periods 502 associated with arcing conditions.

FIG. 6E illustrates the amplitude of indicator 4 over time for the sampled current of FIG. 6A. It will be remembered that indicator 4 (reference 404, FIG. 5) concerns differences between the maximum values frequency components of the low frequency spectra for two subsequent short-time observation windows in a predetermined frequency interval around the central value of one or more predetermined low frequency harmonics which are integer multiples of the fundamental frequency of the current signal. The difference in maximum values indicator may consider multiple harmonics where the presence of harmonics may depend on load conditions as well as the presence of an arcing condition. In some load conditions, the harmonics may represent typical harmonics that are present in arc fault conditions but otherwise not present with respect to conventional operation of the electric circuit in the absence of an arc. Thus, the detection of such harmonics would be indicative of an arc fault. Conversely, the harmonics may represent typical harmonics that are present both in the presence and absence of an arc fault. However, in a masked load conditions the harmonics are stationary and assume low amplitude values, while in an arc fault condition the harmonics may be non-stationary and have high amplitude values. Evaluation of harmonic movement and amplitude relative to certain thresholds will accordingly provide information indicative of the presence of an arc fault. In FIG. 6E it will be noted that value of the indicator 4 is small to zero during time periods 501 associated with non-arcing conditions, and conversely is large during time periods 502 associated with arcing conditions.

FIG. 6F illustrates the amplitude of indicator 5 over time for the sampled current of FIG. 6A. It will be remembered that indicator 5 (reference 405, FIG. 5) concerns differences in frequency components of the low frequency signal spectra (other than the harmonic components at integer multiples of the fundamental frequency of the current signal) for two subsequent short-time observation windows. The measured difference indicator provides information indicative of non-stationary behavior of the current signal waveform. Where the measured difference indicator assumes a small (ideally nil) value less than a set small threshold value, a conclusion may be reached that the signal is stationary. On the other hand, if the measured difference indicator exceeds the set threshold, a conclusion may be reached that the signal is non-stationary. In FIG. 6F it will be noted that value of the indicator 4 is small during time periods 501 associated with non-arcing conditions, and conversely is large during time periods 502 associated with arcing conditions.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An arc fault detection circuit, comprising:
   a current sensing circuit configured to be coupled to a line conductor carrying a current, sense said current and output data indicative of said sensed current; and
   a processing circuit configured to transform the output data to frequency data for frequency components of said sensed current in a low frequency range, said processing circuit further configured to identify an arc fault condition on the line conductor by identifying differences in said frequency data between at least two observation windows;
   wherein the identified differences comprise a plurality of difference measurements including a first group of difference measurements and a second group of difference measurements,
   said processing circuit further configured to identify a possible arc fault condition if any difference measurements of the first group exceed their corresponding threshold, and further confirm the arc fault condition if a majority of the difference measurements of the second group exceed their corresponding thresholds.

2. The circuit of claim 1, wherein the two observation windows are consecutive.

3. The circuit of claim 1, wherein the current sensing circuit comprises:
   a current sensor;
   a sample and hold circuit coupled to an output of the current sensor; and
   an analog-to-digital conversion circuit coupled to an output of the sample and hold circuit.

4. The circuit of claim 1, further comprising:
   a tripping unit coupled in the line conductor, said tripping unit configured to de-energize the line conductor in response to receipt of an arc fault signal generated by the processing unit.

5. The circuit of claim 1, wherein the processing circuit is configured to calculate a summation of differences between said frequency data in two observation windows and compare the calculated sum to a threshold, wherein the calculated sum in excess of the threshold is indicative of the arc fault condition.

6. The circuit of claim 1, wherein the line conductor carries a power signal having a fundamental frequency; and wherein the processing circuit is configured to calculate differences between said frequency data in two observation windows at frequency locations near but not including harmonics of the fundamental frequency and compare the calculated differences to a threshold, wherein the calculated differences in excess of the threshold are indicative of the arc fault condition.

7. The circuit of claim 6, wherein the calculated differences relate to maximum values of the frequency data within a range of frequency locations surrounding the harmonics.

8. The circuit of claim 1, wherein the processing circuit is configured to calculate a mean value of differences between said frequency data in two observation windows and compare the calculated mean value to a threshold, wherein the calculated mean value in excess of the threshold is indicative of the arc fault condition.

9. The circuit of claim 1, wherein the processing circuit is further configured to identify the arc fault condition on the line conductor by identifying differences in sensed current between two observation windows and compare the differences to a threshold, wherein the differences in excess of the threshold are indicative of the arc fault condition.

10. The circuit of claim 1, wherein the low frequency range is between 0 and 5 kHz and wherein a spectral resolution of the frequency data is less than a few Hz and wherein the each observation window has a length of less than a few tens of milliseconds.

11. The circuit of claim 10, wherein the low frequency range is between 0 and 1 kHz and wherein the spectral resolution is less than 1 Hz.

12. The circuit of claim 1, wherein said differences in said frequency data between two observation windows provide an indication of whether the frequency components of said current are non-stationary, said processing circuit further configured to compare a non-stationary indicator value to a threshold, said non-stationary indicator value in excess of the threshold being indicative of the arc fault condition.

13. An arc fault detection circuit comprising:
    a current sensing circuit configured to be coupled to a line conductor carrying a current, sense said current and output data indicative of said sensed current; and
    a processing circuit configured to transform the output data to frequency data for frequency components of said sensed current in a low frequency range, said processing circuit further configured to identify an arc fault condition on the line conductor by identifying differences in said frequency data between at least two observation windows;
    wherein the processing circuit implements a high resolution frequency transform algorithm to transform the output data to frequency data in the low frequency range with a high spectral resolution and a short time observation window.

14. The circuit of claim 13, wherein the high resolution frequency transform algorithm is a Chirp-Z Transform.

15. The circuit of claim 13, wherein the low frequency range is between 0 and 5 kHz; wherein the high spectral resolution is less than a few Hz; and wherein the short time observation window is less than a few tens of milliseconds.

16. A method for arc fault detection, comprising:
    sensing current in a line conductor and outputting data indicative of said sensed current;

transforming the output data to frequency data for frequency components of said sensed current in a low frequency range; and identifying an arc fault condition on the line conductor by identifying differences in said frequency data between at least two observation windows;

wherein identifying comprises:

performing a plurality of difference measurements including a first group of difference measurements and a second group of difference measurements;

identifying a possible arc fault condition if any difference measurements of the first group exceed their corresponding threshold; and confirming the arc fault condition if a majority of the difference measurements of the second group exceed their corresponding thresholds.

17. The method of claim 16, wherein the two observation windows are consecutive.

18. The method of claim 16, wherein identifying comprises calculating a summation of differences between said frequency data in two observation windows and comparing the calculated sum to a threshold, wherein the calculated sum in excess of the threshold is indicative of the arc fault condition.

19. The method of claim 16, wherein the line conductor carries a power signal having a fundamental frequency; and identifying comprises calculating differences between said frequency data in two observation windows at frequency locations near but not including harmonics of the fundamental frequency and comparing the calculated differences to a threshold, wherein the calculated differences in excess of the threshold are indicative of the arc fault condition.

20. The method of claim 19, wherein the calculated differences relate to maximum values of the frequency data within a range of frequency locations surrounding the harmonics.

21. The method of claim 16, wherein identifying comprises calculating a mean value of differences between said frequency data in two observation windows and comparing the calculated mean value to a threshold, wherein the calculated mean value in excess of the threshold is indicative of the arc fault condition.

22. The method of claim 16, wherein identifying comprises identifying differences in sensed current between two observation windows and comparing the differences to a threshold, wherein the differences in excess of the threshold are indicative of the arc fault condition.

23. The method of claim 16, wherein the low frequency range is between 0 and 5 kHz and wherein a spectral resolution of the frequency data is less than a few Hz and wherein the each observation window has a length of less than a few tens of milliseconds.

24. The method of claim 23, wherein the low frequency range is between 0 and 1 kHz and wherein the spectral resolution is less than 1 Hz.

25. The method of claim 16, wherein identifying comprises determining whether the frequency components of said current are non-stationary and comparing a non-stationary indicator value to a threshold, said non-stationary indicator value in excess of the threshold being indicative of the arc fault condition.

26. A method for arc fault detection, comprising:

sensing current in a line conductor and outputting data indicative of said sensed current;

transforming the output data to frequency data for frequency components of said sensed current in a low frequency range; and identifying an arc fault condition on the line conductor by identifying differences in said frequency data between at least two observation windows;

wherein transforming comprises implementing a high resolution frequency transform algorithm to transform the output data to frequency data in the low frequency range with a high spectral resolution and a short time observation window.

27. The method of claim 26, wherein the high resolution frequency transform algorithm is a Chirp-Z Transform.

28. The method of claim 26, wherein the low frequency range is between 0 and 5 kHz; wherein the high spectral resolution is less than a few Hz; and wherein the short time observation window is less than a few tens of milliseconds.

* * * * *